United States Patent [19]

Iya

[11] 4,424,199

[45] Jan. 3, 1984

[54] FLUID JET SEED PARTICLE GENERATOR FOR SILANE PYROLYSIS REACTOR

[75] Inventor: Sridhar K. Iya, Williamsville, N.Y.

[73] Assignee: Union Carbide Corporation, Danbury, Conn.

[21] Appl. No.: 329,956

[22] Filed: Dec. 11, 1981

[51] Int. Cl.³ .................... C01B 33/02; B05D 7/00; B02C 19/06
[52] U.S. Cl. .................................. 423/349; 241/5; 427/213; 423/DIG. 16
[58] Field of Search .............. 423/349, DIG. 16, 350; 427/213; 241/5

[56] References Cited

U.S. PATENT DOCUMENTS

| 3,012,861 | 12/1961 | Ling ........................ 427/213 |
| 3,012,862 | 12/1961 | Bertrand et al. .......... 427/213 |
| 3,897,010 | 7/1975 | Weishaupt et al. ....... 241/5 |
| 4,092,446 | 5/1978 | Padovani et al. ......... 427/213 |
| 4,172,667 | 10/1979 | Zenz et al. ............ 423/DIG. 16 |
| 4,207,360 | 6/1980 | Padovani ................. 427/213 |

FOREIGN PATENT DOCUMENTS

521842 2/1956 Canada ................. 423/DIG. 16

Primary Examiner—Earl C. Thomas
Assistant Examiner—Steven Capella
Attorney, Agent, or Firm—Frederick J. McCarthy, Jr.

[57] ABSTRACT

Method is provided for generating fine sized seed particles of silicon for use in the fluidized bed pyrolysis of silane.

7 Claims, 8 Drawing Figures

FLUID JET SEED PARTICLE GENERATOR FOR SILANE PYROLYSIS REACTOR

STATEMENT

The invention described herein was made in the performance of work under NASA Contract Number NAS 7-100, JPL No. 954334, for high purity silicon and is subject to the provisions of Section 305 of the National Aeronautics and Space Act of 1958 (72 Stat. 435; 42 U.S.C. 2457).

BACKGROUND OF THE INVENTION

This invention relates to silane pyrolysis in a fluidized bed. Fluidized bed silane pyrolysis, using fluidized silicon particles to receive deposits of silicon product, can utilize a conventional boot separator collecting chamber below the fluidized bed to receive enlarged silicon product particles descending from the bed. The improvement of the present invention concerns the generation of small seed particles in the boot separator collecting chamber using a fluid jet arranged therein to grind a portion of the large product particles to form small seed-sized particles which are returned to the fluidized bed reaction zone with the advantage of avoiding contamination associated with externally produced seed particles.

As the energy demands of the world continue to increase, there is an increasing interest in renewable energy sources such as solar energy. Currently, one of the drawbacks of solar energy is the high cost of the high-plurality silicon needed to produce the photovoltaic cells that convert sunlight to electricity. A current development of an improved process to upgrade metallurgical grade silicon to the ultra-high purity silicon needed for low cost solar energy involves the conversion of metallurgical grade silicon to ultra-high purity silane which can then be pyrolyzed to produce ultra-high purity silicon product. The pyrolysis step utilizes a fluid bed reactor arrangement whereby silane is introduced into a heated, fluidized bed of silicon particles whereby the silane is decomposed into silicon product and hydrogen by-product. The decomposition causes fluidized silicon particles to grow larger due to the deposit thereon of silicon product and by-product hydrogen gas can be conventionally removed. U.S. Pat. No. 4,292,344, incorporated herein by reference, discloses such a fluidized bed operation. Capacitive heating is disclosed in the aforementioned patent, however, other types of heating are also used as disclosed in U.S. Pat. Nos. 3,012,861 and 3,012,862. In order to sustain continuous operation of the fluidized bed reactor, it is necessary to introduce small silicon seed particles to replenish those which become enlarged with silicon product and descend from the bed. The replenishing seed particles then in turn grow to a larger size by the deposit of silicon product thereon.

A conventional means for recovering enlarged silicon particles which descend from the fluidized bed reaction zone is a bottom boot separator. The boot separator is a relatively small diameter cylindrical chamber positioned below the fluidized bed. Silane gas and/or some by-product hydrogen is passed upwardly through a perforated bottom portion of the boot separator through the boot separator chamber into the fluidized bed. This gas flow is regulated by techniques well known in the art so that smaller particles are carried from the boot separator and maintained within the fluidized bed as seed particles until they reach an enlarged size due to deposition of silicon thereon whereupon the enlarged particles descend from the fluidized bed into the boot separator and can be removed therefrom as product material.

As noted hereinabove, the fluidized bed requires a replenishment of small seed particles of silicon in order for the system to operate in a continuous fashion. A prior technique was to grind a small fraction of recovered product material in external grinding means and then to introduce the resulting small particles into the fluidized bed. Such an arrangement is workable but has the disadvantages of requiring auxiliary equipment outside of the reactor and additional handling of the silicon material which leads to the possibility of contamination and adds to the complexity and cost of the system.

OBJECTS OF THE INVENTION

It is an object of this invention to provide an improved means for generating silicon seed particles for a fluidized bed silane pyrolysis reactor.

It is another object of this invention to provide a seed particle generator that can be utilized with a boot separator associated with the fluidized bed silane pyrolysis reactor.

It is another object of this invention to provide a fluid jet seed particle generator for silane pyrolysis reactor that can utilize fluids associated with the reaction itself.

It is another object of this invention to provide seed particle generation means for fluidized bed silane pyrolysis reactor that is internal to the reactor and minimizes handling of the silicon particles.

SUMMARY OF THE INVENTION

The method of the present invention includes the use of a fluid jet located within a boot separator chamber associated with a fluidized bed silane pyrolysis reactor. The boot separator receives the enlarged silicon particles which segregate from the fluidized bed by settling when silane is decomposed to deposit silicon and form large particles. The enlarged particles in the boot separator are preferably maintained in a fluidized condition by an upwardly flowing gas. The fluid jet positioned within the boot separator chamber has a velocity sufficient to create a turbulent flow of gas in a portion of the boot separator chamber containing enlarged silicon product particles causing a portion of such particles to impinge upon each other and thus be comminuted to seed sized particles. The rising gas within the boot separator carries the thus formed small seed-sized particles from the boot separator chamber into the fluidized bed. The larger silicon product particles remain in the collecting chamber. The replenishing seed particles thus provided become growth sites for the on-going silane pyrolysis.

The nozzle which establishes the fluid jet should preferably be in line with and on the axial centerline of the boot separator and should suitably have a diameter of about 1/100 to 1/10 of the boot separator chamber so as not to interfere with descending large particles and the upward flow of the gas in the chamber. Preferably, the nozzle end should be at about the axial mid-point of the boot separator chamber. Although the center placement of the fluid jet nozzle is preferred, the method is workable with variations from this placement, so long as the jet velocity provides a turbulence which causes silicon particles to impinge upon each other but is insufficient to cause significant impingement of particles on the surfaces of the boot separator chamber. The turbulence should be of a high order which causes particles to be ground upon each other as in jet milling techniques (see Chemical Emgineer's Handbook—Perry and Chilton, 5th Edition McGraw—Hill). The nozzle position can be radially offset from the axial centerline of the boot separator and the nozzle direction can be angled from the axial centerline. The jet nozzle end is advantageously positioned from ¼ to ¾ of the height of the boot separator chamber. A vertically downward nozzle position is not an absolute requirement, since a horizontal or even an upward orientation could be satisfactory.

In the practice of the present invention, the gas used to effect comminution is preferably recycled hydrogen by-product, but silane or an inert gas such as argon or helium can be used. The jet velocity at the nozzle should be in the range of about 100 ft/sec. to 1200 ft/sec., preferably in the range of 400 to 800 ft/sec. and about 50 to 5000 times the velocity of the transporting gas passing upward through the boot separator chamber. These gas velocities and nozzle placement will ensure that the fluid serves to generate the required grinding action on the product silicon within the boot separator.

DETAILED DESCRIPTION OF THE INVENTION

A method in accordance with the present invention comprises introducing a flow of silane gas or a silane-hydrogen gas mixture into a fluidized bed of fine sized silicon particles suspended in a reaction zone by an upward flow of fluidizing gas said reaction zone temperature being maintained within the decomposition temperature range of silane and the melting point temperature of silicon whereby silane is decomposed to form silicon which deposits on fine sized silicon particles to enlarge the same and cause said enlarged particles to descend as silicon product particles from said fluidized bed through said upward flow of fluidizing gas into a collecting chamber having interior surfaces including side walls and a perforated base through which an upward flow of gas is introduced which passes through said collecting chamber into said fluidized bed reaction zone, providing in said collecting chamber a jet of gas which is directed so as to provide turbulence in said collecting chamber and cause a portion of enlarged silicon product particles in said collecting chamber to impinge upon each other with a force sufficient to cause comminution of said enlarged silicon product particles and the formation of smaller particles which are transported upwardly into said reaction zone by said gas flow passing upwardly through said perforated base, said gas flow having a velocity sufficient to upwardly transport the smaller comminuted particles, but insufficient to upwardly transport uncomminuted silicon product particles while preferably having a velocity sufficient to fluidize the silicon product particles in the collecting chamber.

An improved process to upgrade metallurgical grade silicon to the ultra-high purity silicon needed for either solar cell application or semi-conductor usage is disclosed in U.S. patent application, Ser. No. 936,091, the disclosure of which is incorporated herein by reference. This process includes reaction of the metallurgical grade silicon with silicon tetrachloride and hydrogen to yield an intermediate trichlorosilane and silicon tetrachloride feed stream. The intermediate feed stream is further processed in a redistribution reactor and distillation column section whereby the trichlorosilane is upgraded and separated into an ultra-high purity silane product and recycle silicon tetrachloride. The high purity silane is then pyrolyzed to produce the ultra-high purity silicon product and recycle hydrogen. The pyrolysis step can be accomplished by utilizing a fluidized bed silane pyrolysis reactor, for example, as described in U.S. Pat. No. 4,292,344 noted hereinabove. The reactor operates in a particular embodiment by fluidizing a bed of silicon particles, e.g. sized about 250 micron average, with a combined stream of product grade silane and recycle hydrogen. Within the fluidized bed, the silane is pyrolyzed to form silicon and hydrogen with the silicon depositing on the silicon particles and the by-product hydrogen flowing from the bed. For optimum operation of the fluidized bed, the silane feed is introduced through suitable gas distributors to the bottom of the bed. Additionally, some of the recycle hydrogen is also introduced to the bottom of the bed. The combined flow of silane and hydrogen is controlled, using well known techniques to fluidize the silicon particles. Both recycle hydrogen and hydrogen from the silane pyrolysis are removed from the top of the bed, cooled and recycled back to the bed. The bed is suitably heated to provide a temperature within the range of the decomposition temperature of silane and below the melting point temperature of silicon, i.e. about 1420° C. For efficient heterogeneous decomposition of the feed gas, with resultant deposit of high purity silicon preferentially on the hot solid seed particles, it is desirable to employ a temperature within the range of from about 390° C. to about 1400° C. Preferable temperatures are in the range of from about 550° C. to about 1000° C. The heating can be provided as described in the abovementioned U.S. Pat. No. 4,292,344 or other well known techniques.

The fluidized bed method described above depends on supplying seed particles of silicon, e.g. sized about 40-100 microns, which form the substrate for the silicon derived from silane decomposition. As the silane is decomposed and the seed particles thereby grow in size, the enlarged product particles, e.g. sized about 400 microns and larger, descend from the fluidized bed, and seed-sized material is introduced to maintain continuous production. The enlarged silicon product particles are collected by use of a conventional boot separator arranged below the fluidized bed pyrolysis reactor. The boot separator has means for fluid introduction, e.g., fluidizing gas, at the bottom thereof and fluidization conditions are established so as to allow only larger silicon particles to settle within the chamber of the boot vessel while transporting the seed-size particles into the fluidized bed reaction zone. These large product particles can then be either continuously or periodically removed as product material. Such large particles are of sufficient size to be easily handled without any undue contamination of the ultra-high purity material. The size of the particles comprising the fluidized bed are not critical to the invention per se and may be maintained within the normal limits commonly employed in the various fluidized bed applications known in the art. In the Ling Patent, U.S. Pat. No. 3,012,861, the use of elemental silicon particles sized to −20 +25 mesh was disclosed. In the Bertrand, et al. Patent, U.S. Pat. No. 3,012,862, high-purity silicon was said to be sized to, for example, −40 +100 mesh, or −60 +100 mesh. The pure silicon formed during the silane decomposition reaction causes the particles to grow or increase in size to the point where they no longer effectively fluidize at the prevailing gas velocities. The nonfluidizable silicon particles, upon reaching such size limit, can be continuously removed from the reaction chamber. While the fluidized bed processing conditions for the practice of the invention are not limited relative to particle or gas characteristics, it is generally preferred that the fluidization conditions range from minimum fluidization velocity to several times this value.

In order to supply replenishing seed particles for the fluidized bed, it is possible to divert a small fraction of the product material and suitably crush or grind this material into small fine seed-sized particles, which can be introduced periodically into the fluidized bed. Upon introduction, such small seed particles become growth sites for silane decomposition as before and would gradually increase in size and be withdrawn from the bed through the boot separator. While such external grinding or crushing and re-introduction of silicon material is a possible means of supplying the fluidized bed with replenishing seed material, it has significant drawbacks. First, the technique requires the handling of silicon material outside of the reactor equipment. Such additional handling increases the possibility of contamination of the material. Further, such external seed generation means has the drawback of needing additional grinding and material handling equipment. Since fine silicon can be difficult to handle, this is not a convenient means of supplying seed material. The method of the present invention eliminates the drawbacks of the previously described methods.

Figure 1:
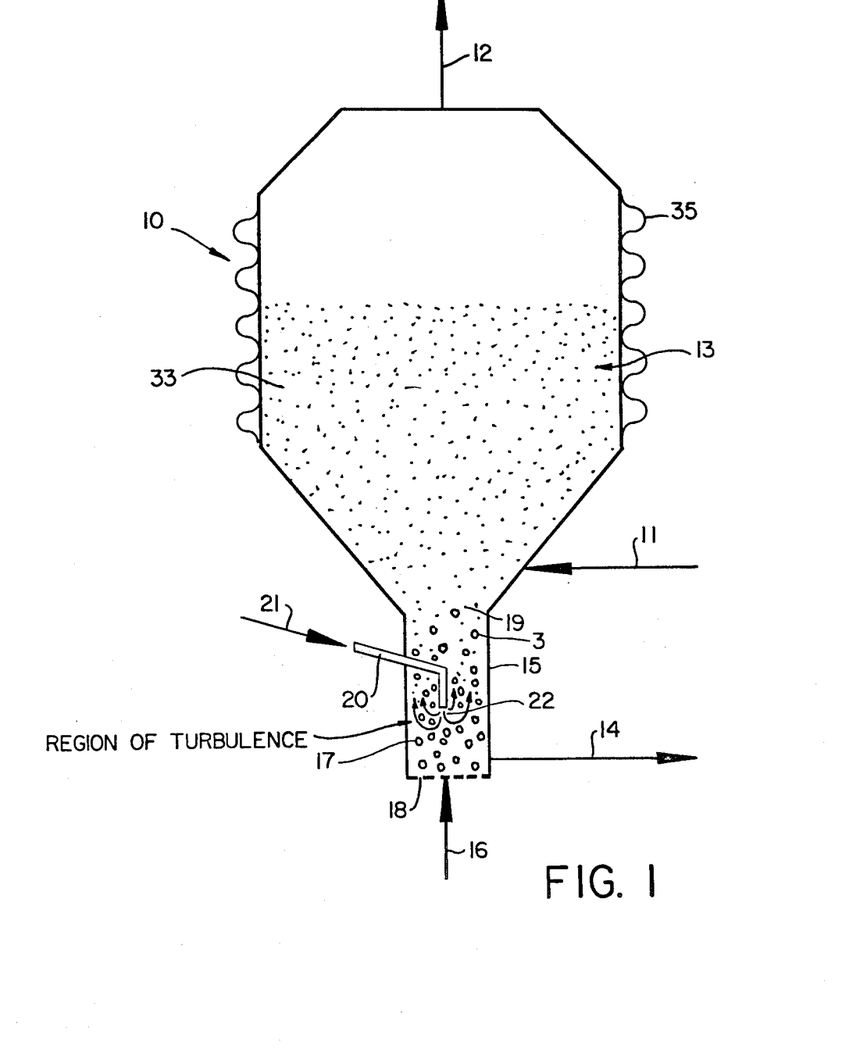
FIG. 1 illustrates a fluid jet seed generator arrangement in accordance with the present invention in combination with a conventional silane pyrolysis fluidized bed reactor and a conventional boot separator.

The present invention will be more fully understood with reference to the drawing wherein FIG. 1 schematically illustrates a silane reactor at 10 which processes ultra-high purity silane feed material entering the reactor at 11 to produce by-product hydrogen which exists at 12 and silicon product particles 3 which are recovered at 14. The pyrolysis reaction occurs in fluidized bed 13 in which are suspended silicon particles 33. The fluidized bed is heated by suitable means 35 to a temperature at which the silane decomposes to produce silicon which deposits on particles 33 in the fluidized bed 13 and causes silicon particles to grow and become enlarged. As the silicon particles in the fluidized bed become enlarged, they reach a size where they are no longer able to be fluidized and will descend from the fluidized bed into a boot separator chamber 15 which is designed to receive the enlarged silicon product particles 3 from the fluidized bed 13. Gas 16, e.g. hydrogen, is introduced through a perforated member 18 at the bottom of the boot separator chamber. The flow of gas 16 is controlled such that it will upwardly transport relatively small seed-sized particles of silicon, but will not interfere with the downward movement of enlarged silicon product particles. Small seed-sized particles will be transported through the top 19 of the boot separator chamber and enter the fluidized bed as seed particles. Such small particles will grow during the reaction in the fluidized bed and become enlarged and descend as silicon product particles into boot separator 15.

Since the gas flow in boot separator chamber 15 is controlled such that only silicon product particles of enlarged size are retained therein, boot separator 15 is an ideal place to introduce small seed-sized particles to replenish the fluidized bed. Such bottom introduction of seed particles is ideal in that the fluidizing silane feed gas 11 is also introduced at the bottom of the fluidized bed 13. This feature ensures that the small seed particles and the silane feed gas are in contact at the bottom of the fluidized bed 13 and have maximum opportunity to react. Recognizing this situation has led to the development of the method of the present invention for generating seed particles for the fluid bed 13. This method includes the placement of a tube 20 into the boot separator chamber 15 such that the nozzle 22 of tube 20 is placed preferably in a downward direction. A suitable fluid 21 which is preferably recycle hydrogen, but could be another inert gas such as argon or helium or even some of the feed silane, is then introduced through tube 20 and exits nozzle 22 as a high velocity jet pointing downward within the boot separator chamber 15. The fluid jet exiting nozzle 22 causes turbulence and some of the silicon product particles in boot separator chamber 15 are moved so as to impinge upon one another and thereby be comminuted into smaller seed-sized particles of silicon. The upward flowing gas 16 transports the generated seed-sized silicon particles upward and through the top 19 of the boot separator 15 into fluidized bed 13. The fluid jet from nozzle 22 causes the enlarged product particles in the boot separator 15 to be abraded and comminuted by contact with each other to generate seed-sized silicon particles. This technique eliminates any handling of the product and generates seed-sized material as needed directly below the fluidized bed. The operation of this fluid jet silicon seed particle generator is prefereably employed in a periodic fashion. That is, the fluid jet seed generator can be operated for a portion of the reactor operating time such as one-quarter to one hour to generate seed-sized particles for the fluidized bed in the reactor. The reactor can then operate on this seed material with the particle size of all the suspended material, increasing and thereby generating larger particles which are suitable for removal as product 14. The product material can then be removed and another batch of seed material generated. The silane pyrolysis reactor itself would operate in a continuous mode with periodic removal of product material and periodic generation of seed material. Although not preferred, it is possible for the fluid jet generator to operate continuously in order to generate some seed material on a continuous basis. However, such continuous operation is not as attractive in terms of interference with removal of the silicon product particles 14. Preferentially, the fluid jet would operate for a short time to generate some fines. Those fines would then be fluidized and grown in the fluidized bed section, with larger particles being generated. Some of the larger generated particles would be removed as product and then seed material would be generated once again.

The preferred placement of the fluid jet seed generator in line with the central axis of the boot separator chamber 15 is illustrated in the FIG. 1. As shown, this indicates the nozzle placement along the axial centerline of the boot separator chamber 15. Preferably, the placement is such that the end of the fluid nozzle 22 is nominally at the axial midpoint of the boot separator 15. Although placement described hereinabove is preferred, this invention is operable with other physical placements of the nozzle. For example, for some equipment considerations, it may be desirable to orient the nozzle downward but at an angle rather than at an orientation perpendicular to inlet gas distributor 18. However, it is expected that the angular placement should be no more than at a 45° angle to the axial centerline. Preferably, the end of the fluid jet nozzle 22 should be at the axial midpoint, but it may be placed either closer to distributor plate 18 or closer to the top 19 of the boot separator 15. It is expected that allowable ranges might be from one-quarter of the axial distance above plate 18 to as much as three-quarters of the boot separator axial distance above plate 18.

Figure 2A:
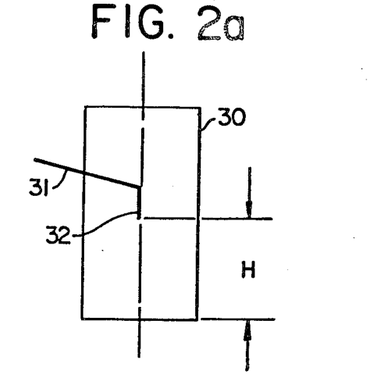
FIG. 2 illustrates schematically various fluid jet nozzle arrangements in accordance with the present invention.
Figure 2B:
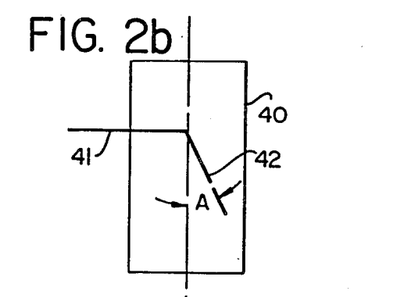
Figure 2C:
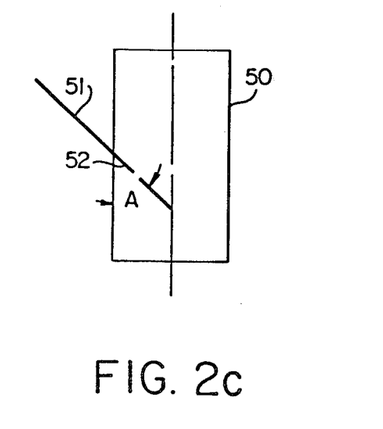
Figure 5:
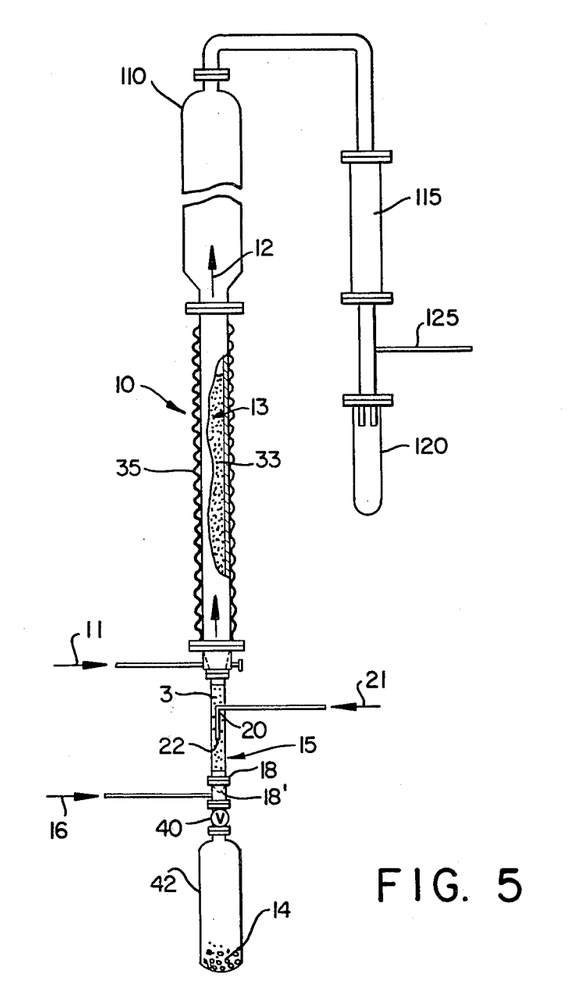
FIGS. 5 and 6 illustrate a particular embodiment of an apparatus for the practice of the present invention.
Figure 6:
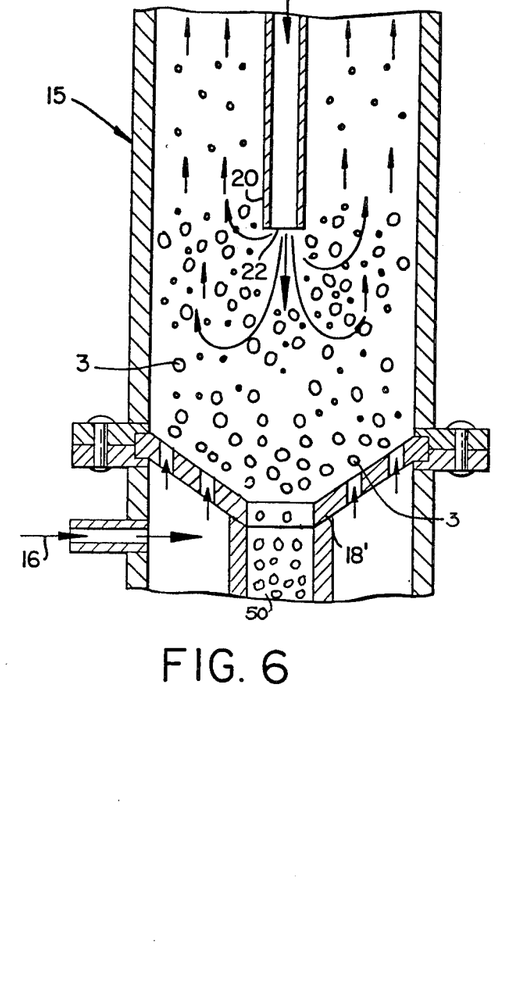

Some of the alternate positions of the fluid jet nozzle within the boot separator section are schematically illustrated in FIG. 2. FIG. 2(A) shows the preferred orientation. The conduit 31 carrying the fluid, passes through the side wall and is oriented with the axial centerline of boot separator 30. The end of the nozzle 32 is positioned preferably at the axial midpoint of boot generator. The nozzle placement distance "H" is preferably one-half the axial length of the boot separator but could be as short as one-quarter boot separator length and as long as three-quarter boot separator length. Another variation that is suitable is illustrated in FIG. 2(B). For this arrangement, the fluid conduit 41 passes through the side wall and into the axial centerline section of the boot separator. However, the nozzle 42 is angled away from the axial centerline by angle A. Another embodiment is illustrated in FIG. 2(C). For this arrangement, the conduit 51 and nozzle 52 are in line, and pass through the wall. The nozzle 52 is angled relative to axial centerline (or the side wall by angle A). It is preferred that the angle between the projection of fluid from the nozzle 52, and the axial centerline should be no more than about 45°. In some instances, horizontal or even upward orientation of the nozzle would be satisfactory. Since the fluid jet is typically high velocities for only a few inches downstream of the nozzle exit, such placement can be workable. The only restriction would be that the nozzle end should be at least several inches from the wall or from the top of the boot separator. The important point is that the nozzle placement is such that the action of the high velocity fluid from that nozzle on the particles within the boot separator will cause some of these particles to impinge upon each other with sufficient force to be comminuted and thereby generate the smaller seed-sized particles required for operation of the fluidized silane pyrolysis bed. FIG. 5 shows a more detailed embodiment of the schematic arrangement of FIG. 1. With reference to FIG. 5, the main fluidizing gas, e.g. feed silane and recycle hydrogen-silane mixture, is introduced at 11 and passes upwardly into reactor 10 to fluidize silicon seed particles 33 in reaction zone 13. Heaters 35 establish a temperature sufficient to decompose the silane to form silicon and hydrogen. The silicon deposits on the seed particles which become enlarged and descend as silicon product particles 3 into boot separator chamber 15. The hydrogen gas by-product passes through head 110 through a cooler unit 115 and filter unit 120 for recovery at 125 and use as a re-cycle fluidizing gas in mixture with silane. The silicon product particles 3 in boot separator chamber 15 are subjected to the action of a jet of gas, e.g. hydrogen, from nozzle 22 which causes the silicon product particles 3 to impinge on each other (but not to any significant extent on the inner surfaces of boot separator chamber 15 or the surface of plate 18), in the course of which the silicon product particles become comminuted with the formation of fine particles of silicon. The thus formed fine particles which have a size smaller than the product particles are swept upwardly by the flow of gas introduced at 16 into the boot separator chamber 15. The upwardly transported particles are carried into reactor 10 where they are fluidized and function as seed particles in the manner previously described. During the generation of fine particles in boot separator chamber 15, valve 40 is suitably closed and can be subsequently opened to collect silicon product particles in hopper 42. FIG. 6 shows in more detail a portion of the fine particle generating portion of the device of FIG. 5. In the embodiment of FIG. 6, gas distributor plate 18 has a conical configuration and a central opening 50 which facillitates collection of silicon product particles in conjunction with valve 40.

The following example will further illustrate the present invention:

EXAMPLE

Figure 3:
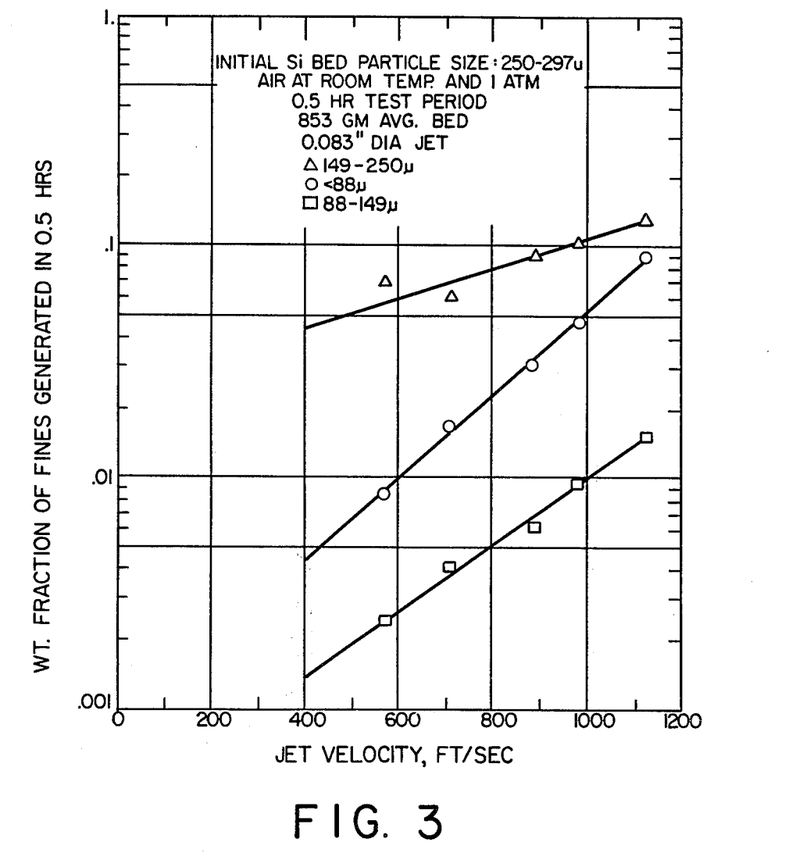
FIG. 3 illustrates the sizing of comminuted particles obtained as a function of fluid jet velocity.

A 0.083 inch diameter tube was placed in line with and on the axial centerline of a 1.5 inch diameter tube 27 inches long. The nozzle was positioned 13.5 inches above a perforated distributor plate. The tube was filled with 853 grams of metallurgical grade silicon ranging in size from $-50$ to $+60$ mesh. This corresponds to product obtained from silicon seed particles sized 250 to 297 microns. Air at room temperature and one atmosphere at a velocity of 0.23 ft/sec. was passed through the distributor plate. Air was fed through the nozzle of the tube so as to obtain jet velocities ranging from about 600 ft/sec. to about 1100 ft/sec. These velocities were maintained for a one-half hour test period and the material obtained was then sized into three size groupings including group one, sizes less than 88 microns; group two, sizes between 88 and 149; and a third group of 149 to 250 microns. The weight fractions of the generated fines were then calculated and are shown in FIG. 3. As can be seen, increased jet velocity resulted in increased generation of fines of all three categories. However, the experimental results indicated that the small size category was proportionately increased at the higher velocities. Basically, this test illustrates that jet velocities in the range of 400 to 1200 ft/sec. were suitable to generate small diameter seed-sized particles for use in a silane pyrolysis fluidized bed reactor.

Figure 4:
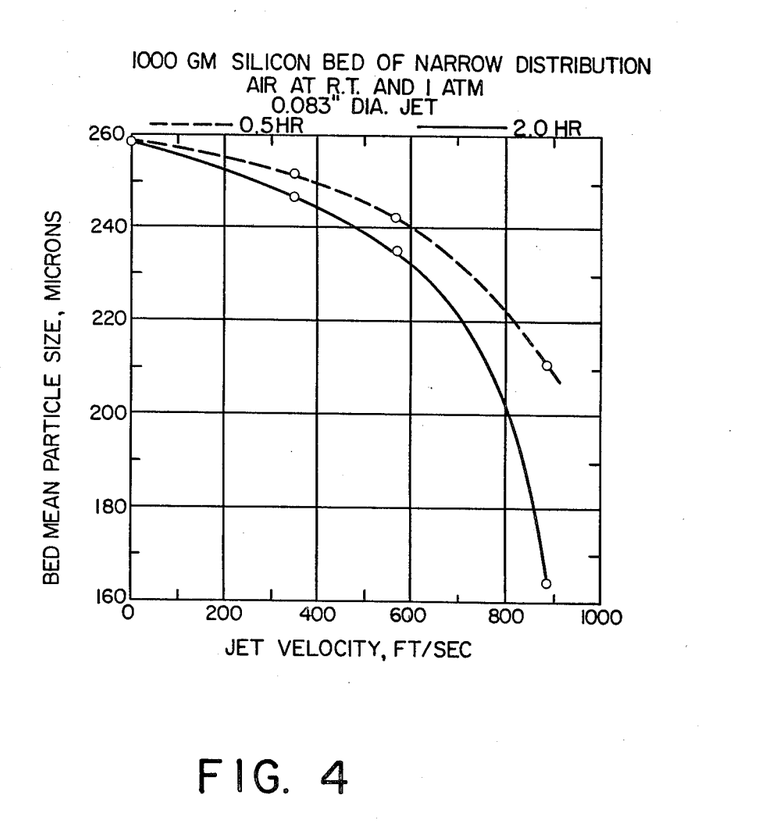
FIG. 4 shows a correlation of bed mean particle size versus fluid jet velocity as a function of operating time.

Additional tests were run in a similar fashion for a two-hour grinding time period. The mean particle size for the bed in microns was then calculated as a function of jet velocities and the two time periods of one-half and two hours, and the functional relationship is illustrated in FIG. 4. As can be seen from FIG. 4, the results indicate that it is possible to utilize the combination of increased jet velocity or grinding time to produce smaller particle sizes as required for seed particle purposes. Generally from these results, one would conclude that velocities in the range of about 100 to 1200 are acceptable but preferred values might range from about 400 to 800 ft/sec. As noted, it is preferred (but not an absolute requirement) to operate the fluid jet seed generator periodically. Such periodic operation would allow generation of the required seed particles, but then allow essentially undisturbed operation of the boot separator. Without the fluid influence associated with the fluid jet generator, the particle separator would behave according to developed correlations and gradually separate the larger particles from the fluidized bed. It is expected that typical operating sequence could be, for example, to operate the fluid jet generator for half an hour, then allow the boot separator to function unhindered for several hours, and then to remove some product silicon particles, perhaps for a quarter or half an hour, and then repeat the cycle.

What is claimed is:

1. In a process for the production of high purity, polycrystalline silicon in a fluidized bed reaction zone by introducing a gas flow of silane or silane-hydrogen mixture into a fluidized bed of fine sized silicon particles suspended in a reaction zone by an upward flow of fluidizing gas, said reaction zone temperature being maintained within the decomposition temperature range of said silane and below the melting point temperature of silicon whereby said silane is decomposed to form silicon which deposits on the silicon particles in the fluidized bed to enlarge the same and cause said enlarged particles to descend as silicon product particles from said fluidized bed reaction zone through said upward flow of fluidizing gas into a collecting chamber having interior surfaces including side walls and a base portion having passages through which an upward flow of gas is introduced which passes into said fluidized bed reaction zone, the improvement which comprises providing in said collecting chamber, in addition to said upward flow of gas, a separate high velocity jet of gas above said base portion at a velocity which is in the range of about 100 to 1200 feet per second and which is from about 50 to 5000 times the velocity of said upward flow of gas said high velocity jet causing turbulence only in a portion of said collecting chamber so as to cause a portion of the enlarged silicon product particles in said chamber to impinge upon each other and be thereby comminuted to form smaller silicon particles which are transported upwardly into said fluidized bed in said reaction zone by said upward flow of gas passing through said perforated base.

2. A process in accordance with claim 1 wherein said jet of gas is provided by a nozzle in-line with and on the axial centerline of said collecting chamber, said nozzle having a diameter of about 1/10 to 1/100 of that of said collecting chamber and the outlet of said nozzle being directed toward said base portion of said collecting chamber.

3. A process in accordance with claim 2 wherein said jet of gas is provided by a nozzle positioned from about $\frac{1}{4}$ to $\frac{3}{4}$ of the height of said collecting chamber and on the axial centerline of said collecting chamber.

4. A process in accordance with claim 1 wherein said temperature is in the range of about 390° C. to 1400° C.

5. A process in accordance with claim 1 wherein said temperature is in the range of about 550° C. to 1000° C.

6. A process in accordance with claim 1 wherein said silicon product particles in said collecting chamber are in a fluidized condition.

7. A method in accordance with claim 1 wherein said silicon product particles are from about 400 microns and larger.

* * * * *